(12) United States Patent
Joisten et al.

(10) Patent No.: US 7,180,146 B2
(45) Date of Patent: Feb. 20, 2007

(54) MINIATURE MAGNETIC FIELD SENSOR

(76) Inventors: Hélène Joisten, 2 Chemin Montrigaud, 38000 Grenoble (FR); Robert Cuchet, Le Village, 38930, Monestier de Percy (FR)

(*) Notice: Subject to any disclaimer, the term of this patent is extended or adjusted under 35 U.S.C. 154(b) by 0 days.

(21) Appl. No.: 11/210,137

(22) Filed: Aug. 23, 2005

(65) Prior Publication Data
US 2006/0033490 A1  Feb. 16, 2006

Related U.S. Application Data

(63) Continuation-in-part of application No. PCT/FR04/000389, filed on Feb. 19, 2004.

(30) Foreign Application Priority Data

Feb. 24, 2003  (FR)  ............................. 03 02238

(51) Int. Cl.
*H01L 43/00* (2006.01)
(52) U.S. Cl. ........................... 257/421; 438/48
(58) Field of Classification Search ................. 438/48; 257/421
See application file for complete search history.

(56) References Cited

U.S. PATENT DOCUMENTS 4,891,725 A  1/1990  Mowry

FOREIGN PATENT DOCUMENTS

| FR | 2 802 650 | 12/1999 |
|---|---|---|
| WO | WO 92/01945 | 2/1992 |
| WO | WO 2004/077074 A2 | 9/2004 |

OTHER PUBLICATIONS

Deak et al., "A Low-Noise Single-Domain Fluxgate Sensor," Appl. Phys. Lett. 69(8), Aug. 19, 1996.
Gottfried-Gottfried et al., "A Miniaturized Magnetic-Field Sensor System Consisting of a Planar Fluxgate Sensor and a Cmos Readout Circuitry," Fraunhofer Institute for Microelectronic Circuits and Systems Ims Dresden, Germany—Sensor and Actuators A54 (1996) 443-447.
Grüger et al., "Performance and Applications of a Two Axes Fluxgate Magnetic Field Sensor Fabricated by a Cmos Process" Fraunhofer Institute for Microelectronic Circuits and Systems Ims Dresden, Germany—Sensor and Actuators A 91 (2001) 61-64.
Koga et al., "Micro Fluxgate Magnetic Sensor Interface Circuits Using ΔΣ Modulation," Toyohashi Univ. of Technology—T IEE Japan, vol. 117-E, No. 2, (1997).
Rub et al., "High Directional Sensitivity of Micromachined Magnetic Fluxgate Sensors," University of Cincinnati, Ohio, 45221-0030—USA, Transducers '01 EUROSENSORS Xv—2001.

*Primary Examiner*—Roy Karl Potter
(74) *Attorney, Agent, or Firm*—Brinks Hofer Gilson & Lione

(57) ABSTRACT

A miniature magnetic field sensor including a magnetic core which co-operates with at least one excitation coil and a detection coil. In the magnetic field sensor, the core is open and includes at least one bar having tapered ends. A method of fabricating the sensor is provided using microtechnology techniques.

16 Claims, 3 Drawing Sheets

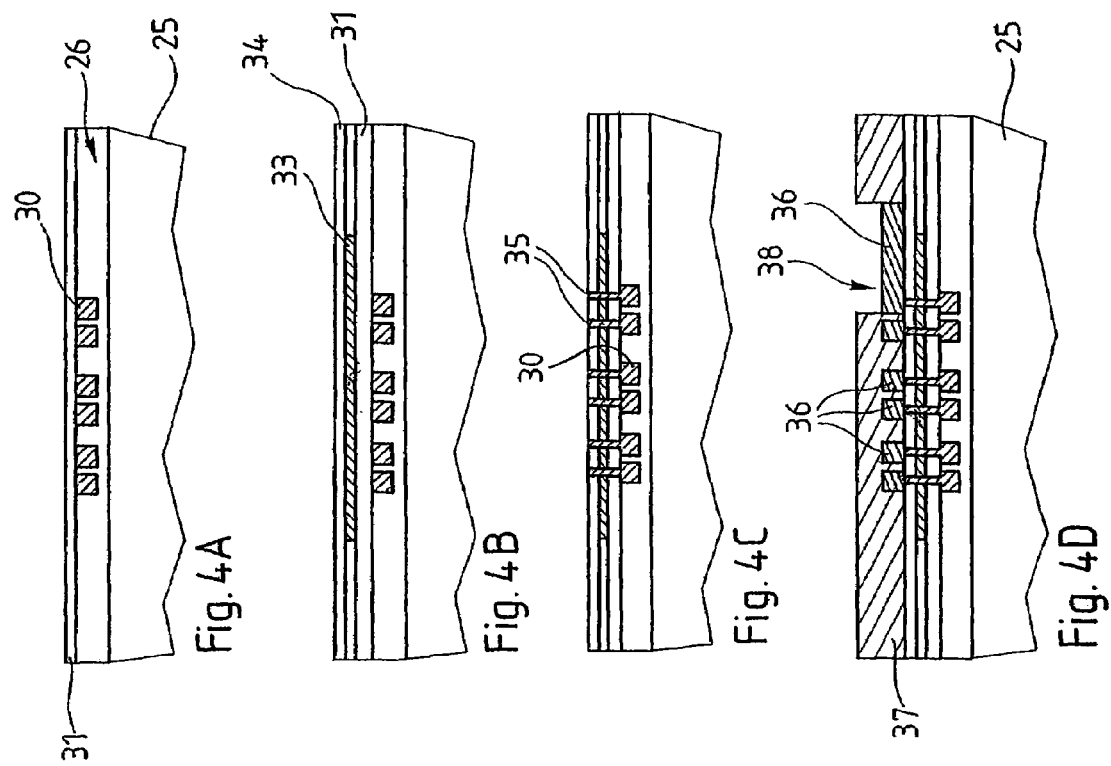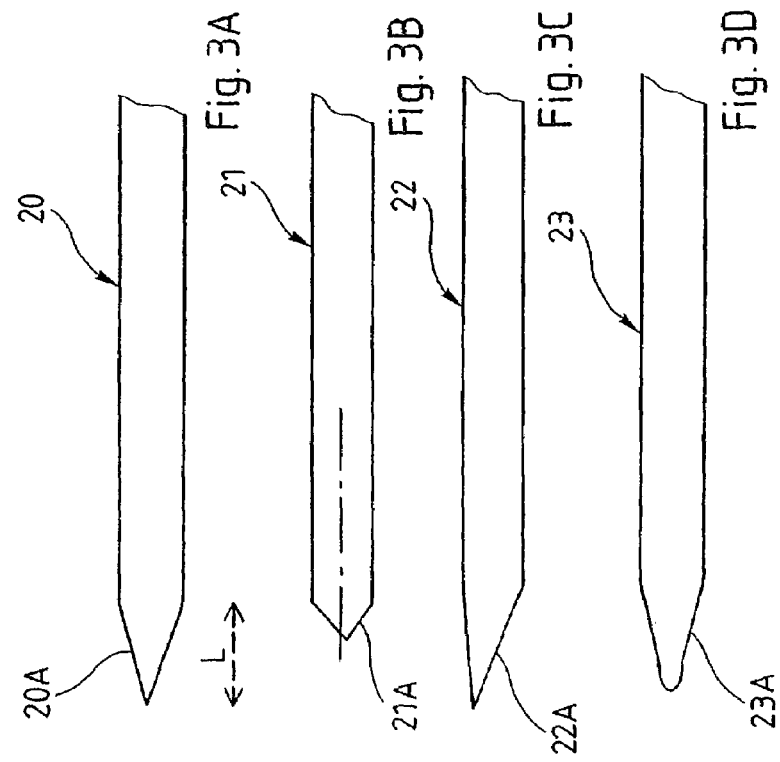

MINIATURE MAGNETIC FIELD SENSOR

This application is a continuation-in-part of PCT application No. FR04/000389, filed Feb. 19, 2004, which claims priority to French patent application No. 0302238, filed Feb. 23, 2003.

TECHNICAL FIELD

The invention relates to miniature magnetic field sensors.

This kind of product is sometimes referred to as a "microflux gate sensor."

BACKGROUND

FIG. 1 is a diagram of a sensor 1 of this kind, with a closed magnetic circuit 2 on elongate branches 3 whereof are wound excitation coils 4 and a detection coil 5.

The sensor is fabricated using the standard microtechnology techniques. Thus the magnetic circuit comprises a soft magnetic material deposited in thin layers (in particular: Permalloy®, amorphous or other material, and the like). The excitation and detection coils are thin layers of a conductive material such as aluminum, copper, gold, and the like. These coils may be solenoidal or planar spirals in particular.

The detection circuit collects the magnetic flux produced by the soft magnetic material when excited by the current flowing in the excitation circuit(s).

The coils may be interleaved.

There may be a supplementary coil to apply a field for compensating the DC or low-frequency magnetic field to be measured. The detection coil may also be used for this purpose, however.

In practice, the signal necessitates an area of saturation of the magnetic material and, in the situation where saturation is achieved, at least in part, the magnetic flux collected by the detection coil no longer has the same alternations in the presence of the DC field to be measured. The detection signal is the derivative of this flux.

This dissymmetry is reflected in the appearance of a second order harmonic in the detection signal linked to the DC field to be measured.

To enhance the measured signal, two detection circuits may be connected in differential mode, in which case the detection signal has twice the frequency of the excitation signal.

The miniature sensors known as "microflux gates" are typically intended for measuring DC or low-frequency magnetic fields (or magnetic field variations) of the order of a few nanoteslas, at the present time, and in a range of approximately +/−100 microteslas. They are used in particular to detect very small variations in the terrestrial magnetic field.

The fact that microflux gates are small has the advantages of great lightness, small bulk (which is beneficial in aerospace and medical applications, in various industrial applications, in clamp ammeters, and the like) and a low fabrication cost, given the use of collective fabrication techniques using the magnetic microelectronic technology.

Examples of microflux gate integrated components are described in the following documents in particular:

"High directional sensitivity of micromachined magnetic fluxgate sensors" by RAHMAN A. RUB, SUKIRTI GUPTA, and CHONG H. AHN—University of Cincinnati, Ohio, 45221-0030-USA, Transducers '01 EUROSENSORS XV-2001, "Performance and applications of a two axes fluxgate magnetic field sensor fabricated by a CMOS process" by H. GRÜGER, R. GOTTFRIED-GOTTFRIED—Fraunhofer Institute for microelectronic circuits and systems IMS Dresden, Germany—Sensor and Actuators A 91 (2001) 61–64, "Micro fluxgate magnetic sensor interface circuits using deltaS Modulation" Shuji KOGA, Akira YAMASAWA, Shoji KAWAHITO—Toyohashi Univ of Technology—T IEE Japan, vol 117-E, N° 2, (1997), "A miniaturized magnetic-field sensor system consisting of a planar fluxgate sensor and a CMOS readout circuitry" by R. GOTTFRIED-GOTTFRIED, W. BUDDE, R. JÄHNE, H. KÜCK—Fraunhofer Institute for microelectronic circuits and systems IMS Dresden, Germany—Sensor and Actuators A54 (1996) 443–447.

The circuits described therein are either closed (looped) or open with parallelepiped-shaped bars.

However, the detection of very weak magnetic fields is in practice prevented by problems of instability or offsets (the expression "offset jumps" is sometimes used). The measurement time signal could theoretically have a noise level of the order of 1 nanotesla, but is in practice greatly degraded by the presence of instabilities or jumps, which can be of the order of 100 to 1000 nanoteslas. These jumps occur at a frequency of a few Hz, but also at a frequency of one per second, one per minute, one per hour or even one per day.

SUMMARY

The subject matter of the invention is a magnetic field sensor which can be implemented using microtechnology techniques and whereof the configuration allows the measurement of weak fields, such as terrestrial magnetic fields, at the same time as minimizing instabilities and jumps.

To this end it proposes a miniature magnetic field sensor comprising a magnetic core cooperating with at least one excitation coil and one detection coil, characterized in that this core is open and includes at least one bar having tapered ends.

According to preferred, and where applicable combined, features:

the core includes at least one second bar having tapered ends, the core is formed of two bars symmetrical to each other with respect to a line separating them, the ends of at least this bar are symmetrical to each other, at least one of the ends of this bar is symmetrical with respect to a longitudinal median line of this bar, at least one of the ends of this bar is dissymmetrical with respect to a longitudinal median line of this bar, at least one of the ends is delimited by rectilinear edges that converge toward each other, at least one of the ends terminates in a sharp point, this point forms an angle less than 45°, preferably less than 30°, at least one of the ends terminates in a rounded point, at least one of the ends has a length greater than the width of the bar, the ends are situated outside the excitation and detection coils, this sensor comprises two excitation coils disposed one on each side of a detection coil, this sensor is formed of a stack of layers.

BRIEF DESCRIPTION OF THE DRAWING

Aspects, features and advantages of the invention emerge from the following description, which is given by way of illustrative and nonlimiting example and with reference to the appended drawings, in which:

FIGS. 3A to 3D are diagrams of bars that may be integrated into the FIG. 2 sensor, FIGS. 4A to 4D are diagrams representing four successive steps in the fabrication of a sensor of the invention.

DETAILED DESCRIPTION

Figure 1:
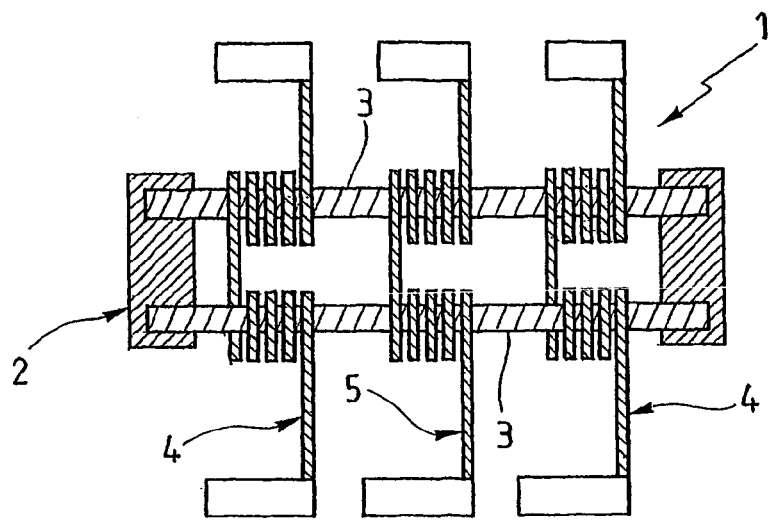
FIG. 1 is a diagram of a standard magnetic field sensor.
Figure 2:
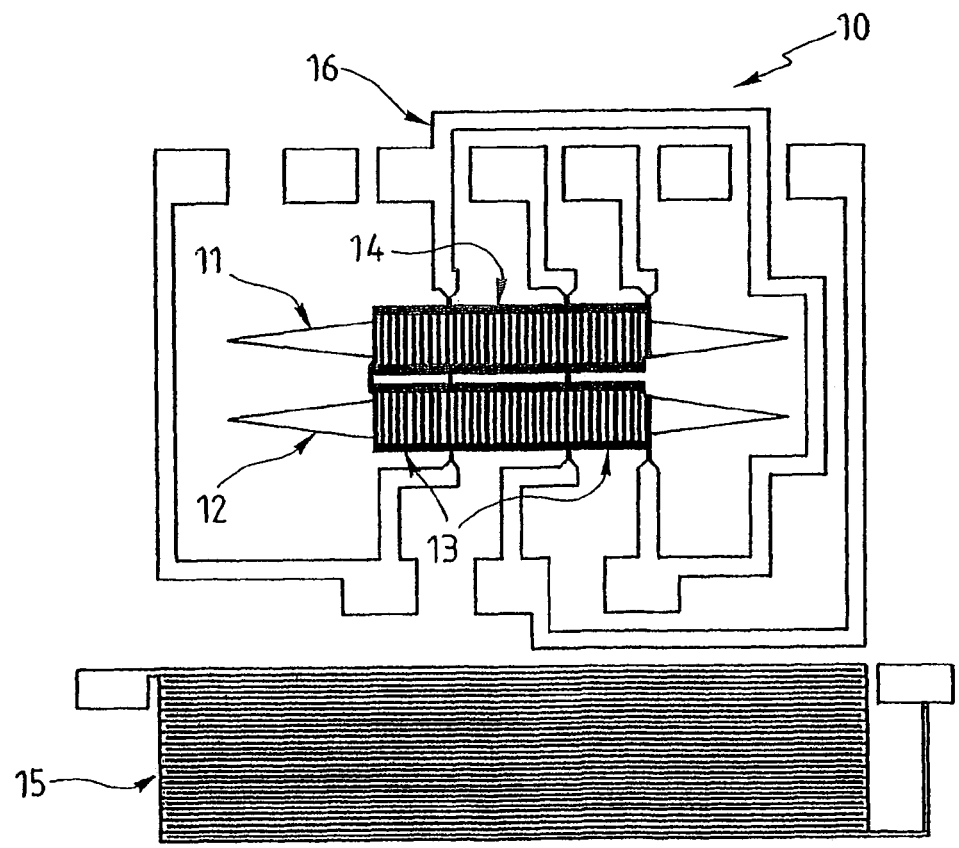
FIG. 2 is a diagram of a magnetic field sensor of the invention.

FIG. 2 represents a sensor of the invention.

This sensor 10 includes an open magnetic core, here formed by two parallel bars 11 and 12 of magnetic material, cooperating with excitation coils 13 and detection coils 14, and metal tracks 15 connected to these coils. This circuit includes tracks 16 in contact with some of the turns of the coils, thus delimiting the coils 13 and 14.

According to the invention, the parallel bars 11 and 12 have tapered or pointed ends. In the context of the invention, a tapered or pointed end is an end of non-constant width, the width decreasing to a narrow, sharp or rounded end. In FIG. 2, the tapered ends of the two bars project from the coils. However, in a variant that is not shown, they may be wholly or partly within the coils.

The angle of the point is advantageously an acute angle (i.e. less than 90°).

FIG. 3A shows a bar 20 similar to those represented in FIG. 2 (in part, in that only its left-hand end is shown); the shape of that end 20A corresponds to a symmetrical geometry, with a very acute angle (less than 45°; this angle is even less than 30° in FIG. 2), the length L of this tapered end being substantially greater than the width of the bar.

Many other pointed end shapes are feasible, however.

Thus FIG. 3B represents a bar 21 having a tapered end 21A whose point is shorter than the width of the bar, the end of that point being also slightly offset downward relative to the median axis of the bar. This point is not symmetrical.

FIG. 3C represents another bar 22 having another elongate point 22A, as in FIG. 3A, but the dissymmetry whereof is such that the point is practically aligned with the upper side of the bar.

Finally, FIG. 3D represents another bar 23 having a tapered end 23A the flanks whereof are not rectilinear, starting off by converging before merging at a widened, blunted "point".

In FIG. 2, each of the bars has ends that are symmetrical to each other. It must nevertheless be understood that the same bar may have two ends with different geometries. It is advantageous, although not essential, for the two bars to be symmetrical to each other with respect to a line separating them; when the ends are non-symmetrical, as in FIGS. 3B and 3C, it may be preferable to move the (sharp or rounded) points of these ends closer together or farther apart.

In a particularly simple version, there is only one bar (11 or 12); it is then advantageous to choose a configuration in which the ends are symmetrical with respect to a median line of the bar, as in FIG. 3A or 3D, for example.

It has been found, surprisingly, that the component from FIG. 2, with bars the ends whereof are tapered, produces better results than several other and more conventional configurations that have been envisaged. With an open circuit, higher current consumption might be expected than with a closed circuit. Moreover, the tapering of the ends of the bars might appear to contribute nothing. However, it has become apparent that it leads to a lower current consumption than the other conventional solutions, whilst being much more stable. It furthermore has a signal/noise ratio of the same order of magnitude as the other known configurations.

It should be noted that the few examples of sensors disclosed in the literature (see above) that propose open circuits all propose parallelepiped-shaped bars.

It is very generally the case in the field of magnetic phenomena that points are often considered to have the effect of configuring magnetic domains. The problem is that it is difficult to monitor the configuration of magnetic domains.

FIGS. 4A to 4D represent by way of example steps in the fabrication of a sensor of the invention.

These steps are hardly modified at all compared to those used for certain miniature sensors already fabricated using microtechnology techniques, but with closed magnetic circuits or open magnetic circuits with right-angle ends.

In FIG. 4A, starting with a substrate 25, for example of silicon (but alternatively of glass, quartz, ceramic, and the like), on which a layer 26 of electrically insulative material (for example $SiO_2$) is to be formed, so forming a kind of "coil box", tracks 30 of a conductive material such as copper, aluminum, gold, tungsten, Ta/Au (layer of tantalum covered with a gold layer), and the like are deposited electrolytically or by catalytic pulverization, after which this material is planarized. Finally, a layer 31 of insulation (typically $SiO_2$ with a thickness of 4 microns, for example) is deposited before it is planarized (leaving for example up to less than 1 micron of insulation on the conductive material).

Then (FIG. 4B) a magnetic material 33 (for example FeNi or an amorphous material), is deposited to a thickness of the order of 1 micron. This magnetic material deposit is then etched to define the geometry, after which it is covered with a new layer 34 of insulation (typically $SiO_2$ that is planarized, leaving for example in the order of 1 micron of insulation on the magnetic material. The layer of magnetic material is therefore localized on an insulative layer 31, under another insulative layer 34, and surrounded with insulation (which in practice is deposited while covering it with the layer 34).

FIG. 4C shows the commencement of operations of producing connections 35 to the lower tracks, so beginning forming the future turns. These connections may be produced by localized etching to excavate trenches as far as the tracks 30 followed by depositing and planarizing a conductive material in the trenches.

In FIG. 4D, a deposit 36 of a conductive material is formed that is typically thicker than 1.5 microns. This is followed by etching to delimit upper conductors in this conductive layer, thus forming turns conjointly with the tracks 30 and the connections 35. This is followed by a deposit 37 of insulation, for example $SiO_2$, after which openings 38 are formed to provide for contacts with the outside.

Figure 5:
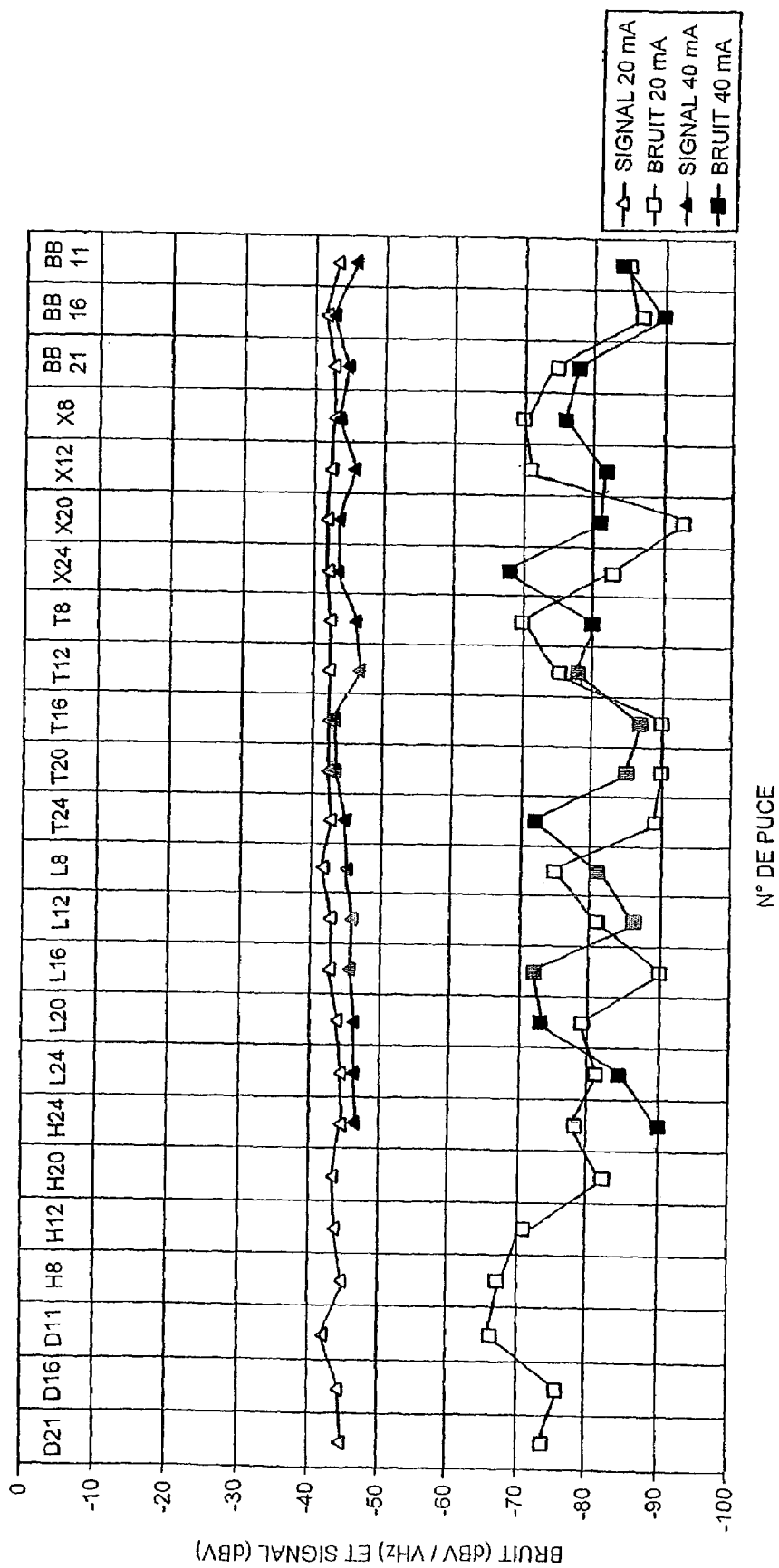
FIG. 5 is a diagram showing the correlation in a sensor of the invention between the noise (in dBV/$\sqrt{Hz}$) and the signal (in dBV) to the number of a chip analyzed in a batch.

For test purposes, a plurality of chips was produced with the geometry cited above in order to evaluate the performance thereof at two currents (20 mA and 40 mA). FIG. 5 sets out the measurement results for these chips (the numbers designating the chips are arbitrary).

It can be seen in this FIG. that the average signal value for 20 mA is −41 dB. This current of 20 mA would seem to be an optimum current in this specific example.

These chips have spectra, without instabilities, at low frequencies, as may be seen in the spectrum (from a few tenths of a Hertz up to 50 Hz; instabilities often occur in this range with the other known configurations). It has also become apparent that the configuration of the invention provides greater stability combined with reduced current consumption, and with a signal/noise ratio of the same order of magnitude, if not better, than these other configurations.

The invention claimed is:

1. A miniature magnetic field sensor comprising a magnetic core cooperating with at least one excitation coil and a detection coil, wherein the core is open and includes at least one bar having tapered ends.

2. The sensor according to claim 1, wherein the core includes at least one second bar having tapered ends.

3. The sensor according to claim 2, wherein the core is formed of two bars symmetrical to each other with respect to a line separating them.

4. The sensor according to claim 2, wherein at least one of the tapered ends of the at least one second bar are symmetrical with respect to a longitudinal median line of the at least one second bar.

5. The sensor according to claim 1, wherein the tapered ends of the at least one bar are symmetrical to each other.

6. The sensor according to claim 1, wherein at least one of the tapered ends of the at least one bar are symmetrical with respect to a longitudinal median line the at least one bar.

7. The sensor according to claim 1, wherein at least one of the ends of the at least one bar is non-symmetrical with respect to a longitudinal median line of the at least one bar.

8. The sensor according to any one of claim 1, wherein at least one of the tapered ends is delimited by rectilinear edges that converge toward each other.

9. The sensor according to claim 1, wherein at least one of the tapered ends terminates in a sharp point.

10. The sensor according to claim 9, wherein the sharp point forms an angle less than 45°.

11. The sensor according to claim 1, wherein at least one of the tapered ends terminates in a rounded point.

12. The sensor according to claim 1, wherein at least one of the tapered ends has a length greater than the width of the at least one bar.

13. The sensor according to any one of claim 1, wherein the tapered ends are situated outside the excitation and detection coils.

14. The sensor according to any one of claim 1 comprising two excitation coils disposed one on each side of the detection coil.

15. The sensor according to claim 1, wherein the second comprises a stack of layers.

16. A method for producing a miniature magnetic field sensor comprising a magnetic core cooperating with at least one excitation coil and a detection coil, the method comprising the steps of:
   providing a substrate;
   forming lower tracks of a conductive material between upper and lower layers of insulative material on the substrate;
   forming a core including a layer of a magnetic material of defined geometry on the upper layer of insulating material, the defined geometry of the layer of magnetic material being such that the core is open and includes at least one bar having tapered ends;
   covering the layer of magnetic material with a third insulative layer so that the layer of magnetic material is surrounded by insulative material;
   forming connections to the lower tracks by excavating trenches down to the lower tracks and depositing a conductive material in the trenches;
   forming a conductive material so as to form turns conjointly with the lower tracks and the connections; and
   depositing a layer of insulative material overlying the conductive material.

* * * * *

UNITED STATES PATENT AND TRADEMARK OFFICE
CERTIFICATE OF CORRECTION

| | | |
|---|---|---|
| PATENT NO. | : 7,180,146 B2 | Page 1 of 1 |
| APPLICATION NO. | : 11/210137 | |
| DATED | : February 20, 2007 | |
| INVENTOR(S) | : Hélène Joisten et al. | |

It is certified that error appears in the above-identified patent and that said Letters Patent is hereby corrected as shown below:

On the Title Page

In column 1, after item (76), insert a new item as follows:
--Assignee: Commissariat a L'Energie Atomique, Paris (FR)--.

Signed and Sealed this

Fifth Day of June, 2007

JON W. DUDAS
*Director of the United States Patent and Trademark Office*